US008184486B2

(12) United States Patent
Lin et al.

(10) Patent No.: US 8,184,486 B2
(45) Date of Patent: May 22, 2012

(54) TUNABLE CURRENT DRIVER AND OPERATING METHOD THEREOF

(75) Inventors: Chrong-Jung Lin, Hsinchu (TW); Ya-Chin King, Taipei (TW)

(73) Assignee: National Tsing Hua University, Hsinchu (TW)

( * ) Notice: Subject to any disclaimer, the term of this patent is extended or adjusted under 35 U.S.C. 154(b) by 784 days.

(21) Appl. No.: 12/344,268

(22) Filed: Dec. 25, 2008

(65) Prior Publication Data

US 2009/0278781 A1 Nov. 12, 2009

(30) Foreign Application Priority Data

May 7, 2008 (TW) .............................. 97116856 A

(51) Int. Cl.
*G11C 16/06* (2006.01)

(52) U.S. Cl. .............. 365/185.23; 365/185.05; 257/321; 257/347; 345/76; 345/82

(58) Field of Classification Search ............. 365/185.23, 365/185.05; 257/347, 321; 345/76, 82
See application file for complete search history.

(56) References Cited

U.S. PATENT DOCUMENTS

| | | | | |
|---|---|---|---|---|
| 4,040,073 | A * | 8/1977 | Luo | 257/66 |
| 5,317,236 | A * | 5/1994 | Zavracky et al. | 438/27 |
| 5,982,004 | A * | 11/1999 | Sin et al. | 257/347 |
| 6,583,775 | B1 * | 6/2003 | Sekiya et al. | 345/76 |
| 6,680,580 | B1 * | 1/2004 | Sung | 315/169.3 |
| 6,836,264 | B2 * | 12/2004 | Shih | 345/82 |
| 7,123,229 | B2 * | 10/2006 | Toyozawa et al. | 345/90 |
| 7,151,513 | B2 * | 12/2006 | Li et al. | 345/76 |
| 7,317,433 | B2 * | 1/2008 | Chen et al. | 345/76 |
| 7,327,357 | B2 * | 2/2008 | Jeong | 345/204 |
| 7,397,448 | B2 * | 7/2008 | Stevenson et al. | 345/76 |
| 7,501,682 | B2 * | 3/2009 | Choi et al. | 257/321 |
| 7,557,782 | B2 * | 7/2009 | Anthony et al. | 345/82 |
| 7,612,749 | B2 * | 11/2009 | Libsch et al. | 345/82 |
| 7,777,698 | B2 * | 8/2010 | Takahara et al. | 345/76 |
| 2004/0080474 | A1 * | 4/2004 | Kimura | 345/82 |

* cited by examiner

*Primary Examiner* — Viet Q Nguyen
(74) *Attorney, Agent, or Firm* — Pai Patent & Trademark Law Firm; Chao-Chang David Pai

(57) ABSTRACT

A tunable current driver comprising a semiconductor memory device and a selective transistor is provided, in which one of the source/drain pair of the semiconductor memory device is electrically coupled with a lighting device, and one of the source/drain pair of the selective transistor is electrically coupled with the gate electrode of the semiconductor memory device. The semiconductor memory device not only acts as "drive transistor" to drive the lighting device, but also is capable of adjusting the threshold voltage thereof.

14 Claims, 5 Drawing Sheets

110

TUNABLE CURRENT DRIVER AND OPERATING METHOD THEREOF

RELATED APPLICATIONS

This application claims priority to Taiwan Application Serial Number 97116856, filed May 7, 2008, which is herein incorporated by reference.

BACKGROUND

1. Field of Invention

The present invention relates to an electric device. More particularly, the present invention relates to a tunable current driver for a flat-panel display.

2. Description of Related Art

Flat panel displays are widely used in many industries and homes. A significant benefit of OLED displays over traditional liquid crystal displays (LCDs) is that OLEDs do not require a backlight to function. OLEDs draw far less power and, when powered from a battery, can operate longer on the same charge. Because there is no need to distribute the backlight, an OLED display can also be much thinner than an LCD panel. OLED-based display devices can also be more effectively manufactured than LCDs and plasma displays.

Just like passive-matrix LCD versus active-matrix LCD, OLEDs can be categorized into passive-matrix and active-matrix displays. Active-matrix OLEDs (AMOLED) require a thin film transistor backplane to switch the individual pixel on or off, and can make higher resolution and larger size displays possible. With use, the gate to source voltage (threshold voltage) of the “drive transistor” of active-matrix display may vary, thereby causing a change in the current passing through the LED. This varying current contributes to the non-uniformity in the intensity of the display.

Another contribution to the non-uniformity in intensity of the display can be found in the manufacturing of the “drive transistor”. In some cases, the “drive transistor” is manufactured from a material that is difficult to ensure uniformity of the transistors such that variations exist from pixel to pixel.

For the foregoing reasons, there is a need for a novel tunable current driver and operating method thereof to solve above-mentioned problem about the non-uniformity in the intensity of the display.

SUMMARY

It is therefore an objective of the present invention to provide a tunable current driver.

In accordance with an embodiment of the present invention, the tunable current driver comprises a semiconductor memory device and a selective transistor. The semiconductor memory device comprises a first gate electrode, a first trapping layer, a first gate oxide layer, a first polysilicon layer and a first source/drain pair. The first trapping layer is disposed under the first gate electrode. The first gate oxide layer is disposed under the first trapping layer. The first polysilicon layer disposed under the first gate oxide layer and on a glass substrate. The first source/drain pair formed in the first polysilicon layer at opposing sides of the first gate electrode, wherein one of the first source/drain pair is electrically coupled with a lighting device. On the other hand, the selective transistor comprising a second gate electrode and a second source/drain pair, where one of the second source/drain pair is electrically coupled with the first gate electrode, the other of the second source/drain pair is electrically coupled with a data line, and the second gate electrode is electrically coupled with a select line.

It is another objective of the present invention to provide an operating method for the above-mentioned tunable current driver.

In accordance with another embodiment of the operating method for the above-mentioned tunable current driver comprises driving the semiconductor memory device to output a driving current, determining whether the driving current is less than a predetermined current, and programming the semiconductor memory device when the driving current is less than a predetermined current.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Figure 1:
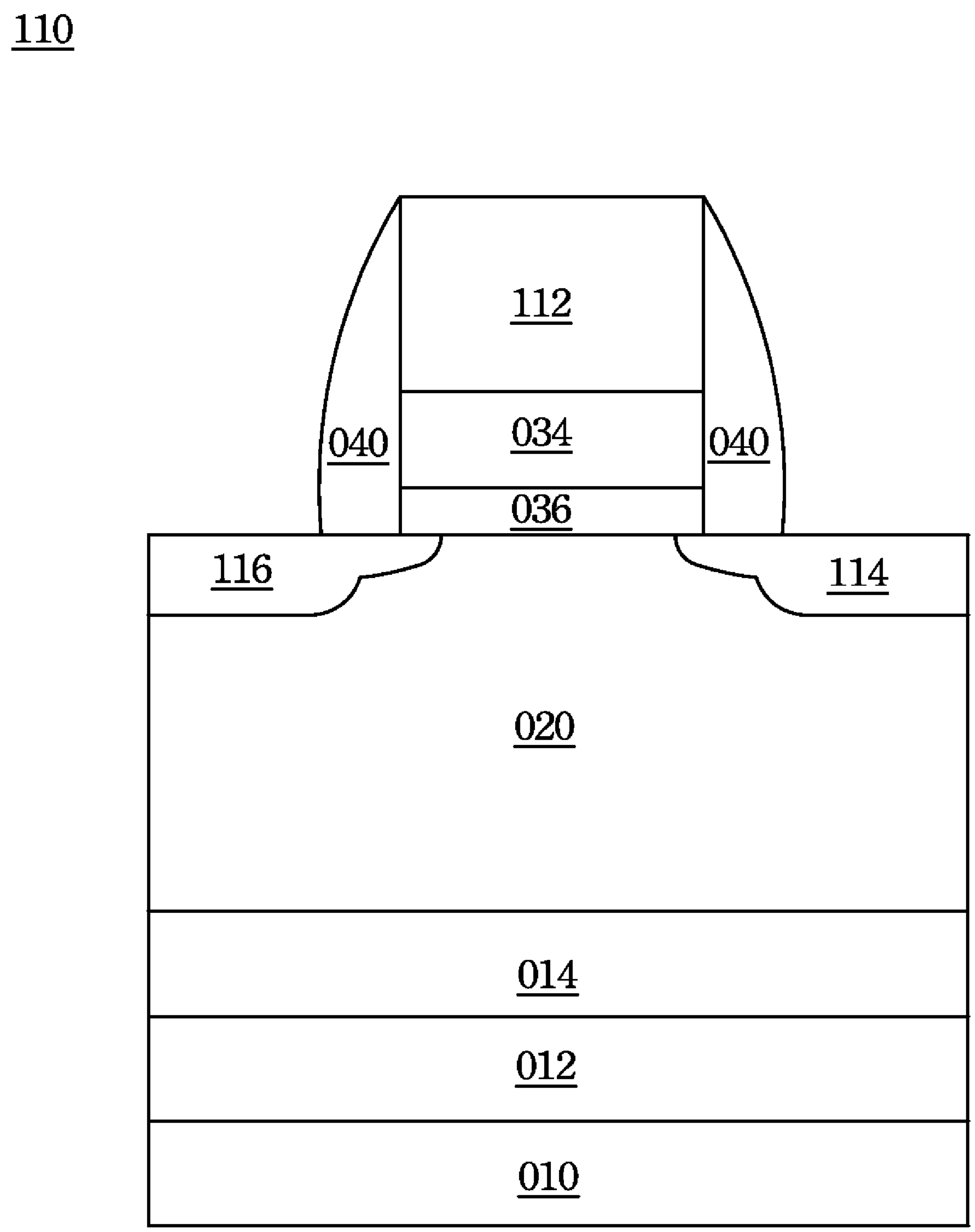
FIG. 1 is a cross-sectional view of a semiconductor memory device in accordance with the illustrative embodiments of the present disclosure.

Reference will now be made in detail to the present preferred embodiments of the invention, examples of which are illustrated in the accompanying drawings. Wherever possible, the same reference numbers are used in the drawings and the description to refer to the same or like parts.

Please refer to FIG. 1. FIG. 1 is a cross-sectional view of a semiconductor memory device in accordance with the illustrative embodiments of the present disclosure. The semiconductor memory device 110 is a thin film transistor (TFT). The semiconductor memory device runs compatibly with OLED, or the like. In FIG. 1, the semiconductor memory device 110 comprises a first gate electrode 112, a first trapping layer 034, a first gate oxide layer 036, a first polysilicon layer 020, a first source/drain pair 116, 114 and spacers 040. The first trapping layer 034 is disposed under the first gate electrode 112. The first gate oxide layer 036 is disposed under the first trapping layer 034. The first polysilicon layer 020 is disposed under the first gate oxide layer 036 and on a glass substrate 010. At least one buffer layer is disposed between the first polysilicon layer 020 and the glass substrate 010. For example, both of the buffer layers 012 and 014 are disposed between the first polysilicon layer 020 and the glass substrate 010, and the buffer layers 012 is disposed under the buffer layers 014, where the buffer layers 012 comprises SiNx, or the like; the buffer layers 014 comprises $SiO_x$, or the like. The first source/drain pair 116 and 114 formed in the first polysilicon layer 020 are separated at opposing sides of the first gate electrode

112. In the embodiments, "source/drain" represents either a source or a drain. For example, one of the first source/drain pair 116 may act as a source and the other of the first source/drain pair 114 may act as a drain; contrarily, one of the first source/drain pairs 116 may act as a drain and the other of the first source/drain pair 114 may act as a source. The spacers 040 are formed alongside the gate electrode 112, the first trapping layer 034 and the first gate oxide layer 036. The gate electrode 112 comprises of a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. The first trapping layer 034 comprises of a nitrogen oxide, such as a SiON; and/or the first trapping layer 034 comprises of a nano-crystal, or the like. Moreover, an insulator layer (not shown) may be disposed between the first trapping layer 034 and the first gate oxide layer 036. Therefore, the insulator layer electrically isolates the first trapping layer 034 and the first gate oxide layer 036, in which the insulator layer may comprise $SiO_2$, or the like.

It should be noted that the semiconductor memory device 110 may be a programmable PMOS. A programming voltage is applied to the gate electrode 112 and the first polysilicon layer 020. Therefore, by using the potential difference between the gate electrode 112 and the first polysilicon layer 020, thereby the threshold voltage of the semiconductor memory device 110 is changed by means of F-N tunneling mechanism, channel hot electron, band-to-band-tunneling mechanism, gate hole injections or the like.

In programming operation, the semiconductor memory device's threshold voltage may be changed. As an example, applying a positive electrical potential, such as 25 V, to the gate electrode 112, and grounding the first polysilicon layer 020. In this way, the potential difference between the gate electrode 112 and the first polysilicon layer 020 may be 25 V, so that electrons/electric charges may be moved from the first polysilicon layer 020 to the first trapping layer 034, where the first trapping layer 034 has many traps and allows electrons/electric charges to be stored therein. Because the semiconductor memory device 110 may be a programmable PMOS, the threshold voltage of the semiconductor memory device 110 shall be raised whenever electrons are stored in the first trapping layer 034. Therefore, applying the positive bias voltage to the gate electrode 112 shall raise the driving current of the semiconductor memory device 110.

Figure 2:
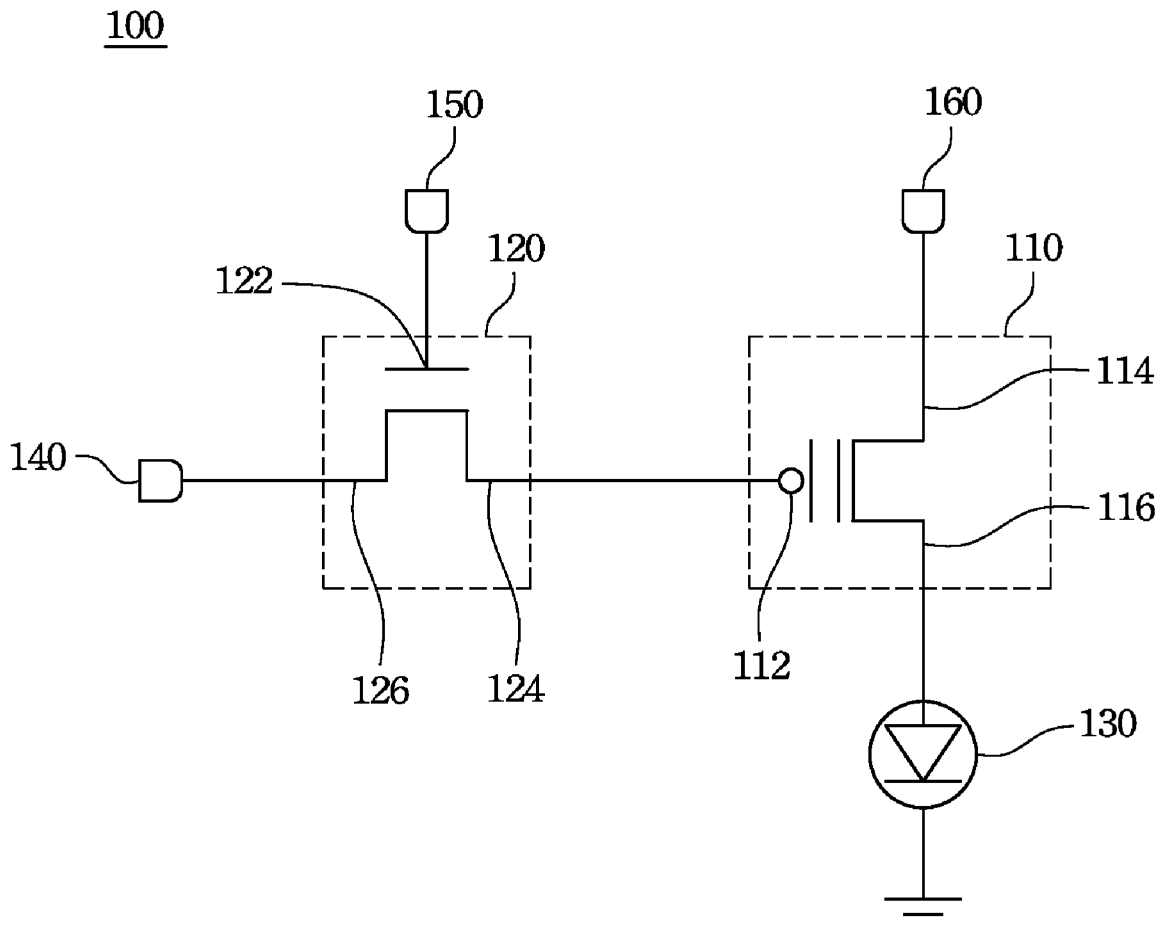
FIG. 2 is a circuit diagram of a tunable current driver according to one or more aspects of the present disclosure.

Please refer to FIG. 2. FIG. 2 is a circuit diagram of the tunable current driver 100 according to one or more aspects of the present disclosure. Pluralities of tunable current drivers 100 may be use in a flat-panel display, in which each pixel of the flat-panel display comprises at least one tunable current driver 100. In FIG. 2, the tunable current driver 100 comprises of the semiconductor memory device 110 and a selective transistor 120, in which one of the first source/drain pair 116 is electrically coupled with the lighting device 130, and the other of the first source/drain pair 114 is electrically coupled with the power supply 160. The selective transistor 120 may comprise a second gate electrode 122 and a second source/drain pair 124 and 126, in which one of the second source/drain pair 124 is electrically coupled with the first gate electrode 112, the other of the second source/drain pair 126 is electrically coupled with a data line 140, and the second gate electrode 122 is electrically coupled with the select line 150. In a preferred embodiment, the selective transistor 120 is a NMOS and the semiconductor memory device 110 is a programmable PMOS.

In addition, the structure of the selective transistor 120 may be essentially the same as the structure of the semiconductor memory device 110. However, the conductivity type of the selective transistor 120 may be different from the conductivity type of the semiconductor memory device 110. For example, the conductivity type of the selective transistor 120 is N-type and the conductivity type of the semiconductor memory device 110 is P-type. Accordingly, the selective transistor 120 may further comprise a second trapping layer, a second gate oxide layer and a second polysilicon layer. The second trapping layer is disposed under the second gate electrode 122. The second gate oxide layer is disposed under the second trapping layer. The second polysilicon layer is disposed under the second gate oxide layer and is disposed on the same glass substrate 010. Moreover, the second source/drain pair 124 and 126 may be formed in the second polysilicon layer at opposing sides of the second gate electrode 122.

It should be understood that an active matrix display has a plurality of pixels; each pixel may comprise thin film transistors and a lighting device. It is hard to prevent some process faults when manufacturing the active matrix display, in which one thin film transistor may be different from another like the transistor's threshold voltage. For the foregoing reasons, the tunable current driver 100 is provided, in which the semiconductor memory device 110 not only acts as "drive transistor" to drive the lighting device, but also is capable of adjusting the threshold voltage thereof (i.e. the above-mentioned function of the semiconductor memory device 110). Accordingly, the same or similar semiconductor memory devices 110 in the display may not have completed the same threshold voltages, respectively. Therefore, driving the same or similar semiconductor memory devices 110 may not output completely the same threshold voltages, respectively. Thus, the brightness of the lighting devices 130 may cause the display device to have non-uniform brightness, which may result in Mura defects. Mura is a Japanese word meaning blemish that has been adopted in English to provide a name for imperfections of a display pixel matrix surface that are visible when the display screen is driven to a constant gray level. Mura defects appear as low contrast, non-uniform brightness regions, typically larger than single pixels.

Figure 3:
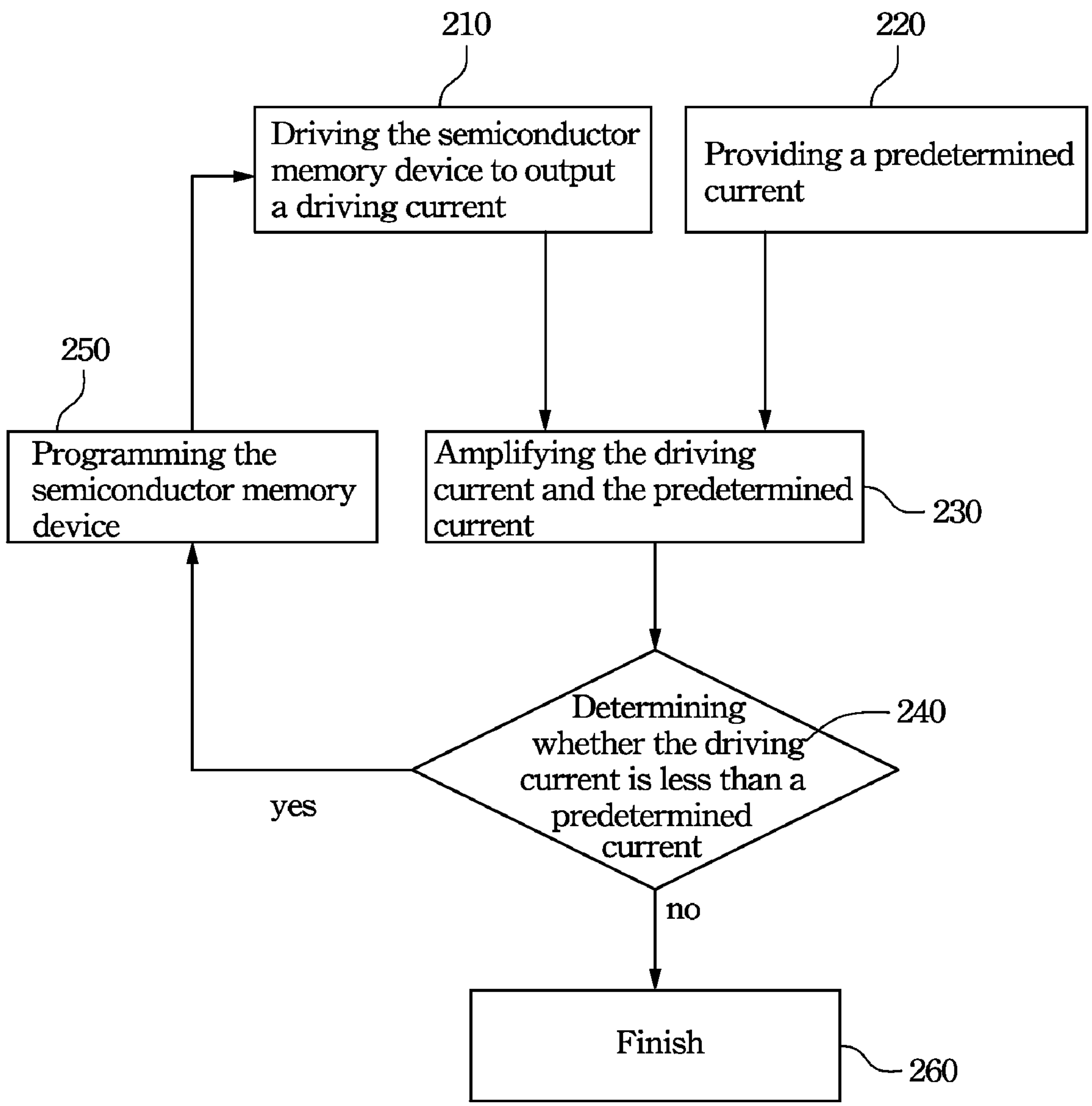
FIG. 3 is a flow-chart diagram of an operating method for the tunable current driver according to one or more aspects of the present disclosure.

In order to solve or circumvent the non-uniformity issue and other problems of the display device, please refer to FIG. 3. FIG. 3 is a flow-chart diagram of an operating method 200 for the tunable current driver 100 according to one or more aspects of the present disclosure. By using the operating method 200, each semiconductor memory devices 110 can be adjusted in the flat-panel display. As an example, by driving the semiconductor memory device 110, one of the first source/drain pair 116 can output a driving current that shall be more than or equal to a predetermined current. If the driving current is less than the predetermined current, the brightness of the lighting device 130 may be so weak; contrarily, if the driving current is more than or equal to the predetermined current, the brightness of the lighting device 130 shall be enough. Moreover, after the driving current is greater than the predetermined current, brightness of the lighting device 130 may be not becoming excessively high if the driving current was still rising. Therefore, the lighting device 130 shall have adequate brightness, no matter what the driving current is greatly more than or just equal to the predetermined current. In the preferred embodiment in which the lighting device 130 is an OLED, and the predetermined current is preferably is between about 1.5 A and about 2 A.

In the step 210, the semiconductor memory device 110 outputs a driving current according to a condition, in which the condition may be that a potential difference is applied between the first gate electrode 112 and one of the first source/drain pair 116 to turn on the semiconductor memory device 110. In one example, the electrical potential of the first gate electrode 112 minus the electrical potential of the one of the first source/drain pair 116 leaves −2 V. In addition, the power supply 160 may apply desirable bias to the other of the first source/drain pair 114 according to the withstanding voltage of the semiconductor memory device 110. The electrical potential that is greater than zero is applied to the second gate electrode 122 via the select line 150, to turn on the selective transistor 120. Moreover, applying an adequate bias to the select line 150 may turn on the selective transistor 120, so that the electrical potential of the data line 140 may be transmitted to the gate electrode 112.

In step 220, the predetermined current is provided. In an embodiment, a standard semiconductor memory device is provided. The standard semiconductor memory device may output the predetermined current under the same conditions as driving the semiconductor memory device 110. For example, the lighting device 130 is an OLED, and the predetermined current is preferably is between about 1.5 A and about 2 A.

In optional step 230, the driving current and the predetermined current are both amplified. In an embodiment, an amplifier amplifies the driving current and the predetermined current, whereby improving the sensing margin in next step 240.

In step 240, whether the driving current is less than the predetermined current is determined. In an embodiment, a determining circuit may determine whether the driving current is less than the predetermined current. The semiconductor memory device 110 may provide an adequate current to the lighting device 130 if the driving current is more than or equal to the predetermined current. Then, in step 260, finish this operation. Moreover, the operating method 200 may adjust another tunable current driver 100 of the active matrix display.

On the other hand, in step 250, the semiconductor memory device 110 is programmed if the driving current is less than the predetermined current. In first embodiment, whenever programming the tunable current driver 100 in which one of the first source/drain pair 116 is electrically coupled with the lighting device 130, a first electrical potential, such as 27 V, is applied to the select line 150, a second electrical potential, such as 25 V, is applied to the data line 140, and a third electrical potential, such as 0 V, to the other of the first source/drain pair 114. In second embodiment, whenever programming the tunable current driver 100 in which one of the first source/drain pair 116 is electrically coupled with the lighting device 130, a first electrical potential, such as 32 V, is applied to the select line 150, a second electrical potential, such as 30 V, is applied to the data line 140, and a third electrical potential, such as 0 V, to the other of the first source/drain pair 114. In the third embodiment, whenever programming the tunable current driver 100 in which one of the first source/drain pair 116 is electrically coupled with the lighting device 130, a first electrical potential, such as 37 V, is applied to the select line 150, a second electrical potential, such as 35 V, is applied to the data line 140, and a third electrical potential, such as 0 V, to the other of the first source/drain pair 114. In the fourth embodiment, whenever programming the tunable current driver 100 in which one of the first source/drain pair 116 is electrically coupled with the lighting device 130, a first electrical potential, such as 42 V, is applied to the select line 150, a second electrical potential, such as 40 V, is applied to the data line 140, and a third electrical potential, such as 0 V, to the other of the first source/drain pair 114. One of ordinary skill in the art will appreciate that the above examples are provided for illustrative purposes only to further explain applications of the present invention and are not meant to limit the present invention in any manner.

Then, the method 200 may proceed to step 210 and/or another step in the operating method 200, and the operating method 200 may be repeated in an iterative manner until the driving current is more than or equal to the predetermined current. Once the driving current is more than or equal to the predetermined current, in step 260, finish this operation. Moreover, the operating method 200 may adjust another tunable current driver 100 of the active matrix display.

Figure 4:
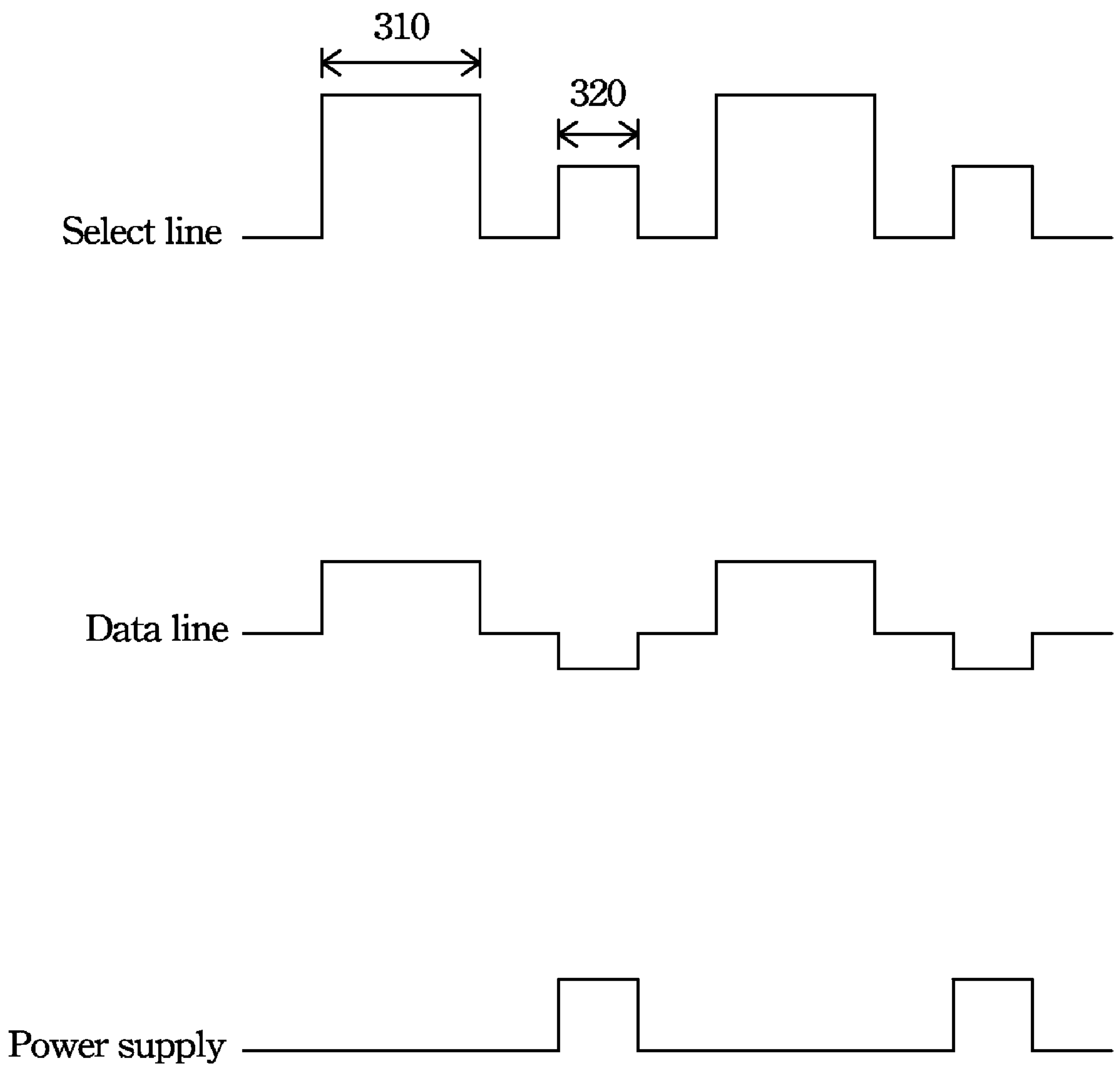
FIG. 4 is a timing diagram showing the wave shape of the respective signals of the tunable current driver.

For a more complete understanding of the present invention, and the advantages thereof, please refer to FIG. 2, FIG. 3 and FIG. 4, where FIG. 4 is a timing diagram showing the wave shape of the respective signals of the tunable current driver. Step 250 is executed during the programming period 310, such as 10 microseconds. Additionally, step 210 is executed during the access period 320, such as 1 microsecond. Step 210 to Step 250 may be repeated in an iterative manner until the driving current is more than or equal to the predetermined current. Once the driving current is more than or equal to the predetermined current, in step 260, this operation is completed. Moreover, the operating method 200 may adjust another tunable current driver 100 of the active matrix display.

Figure 5:
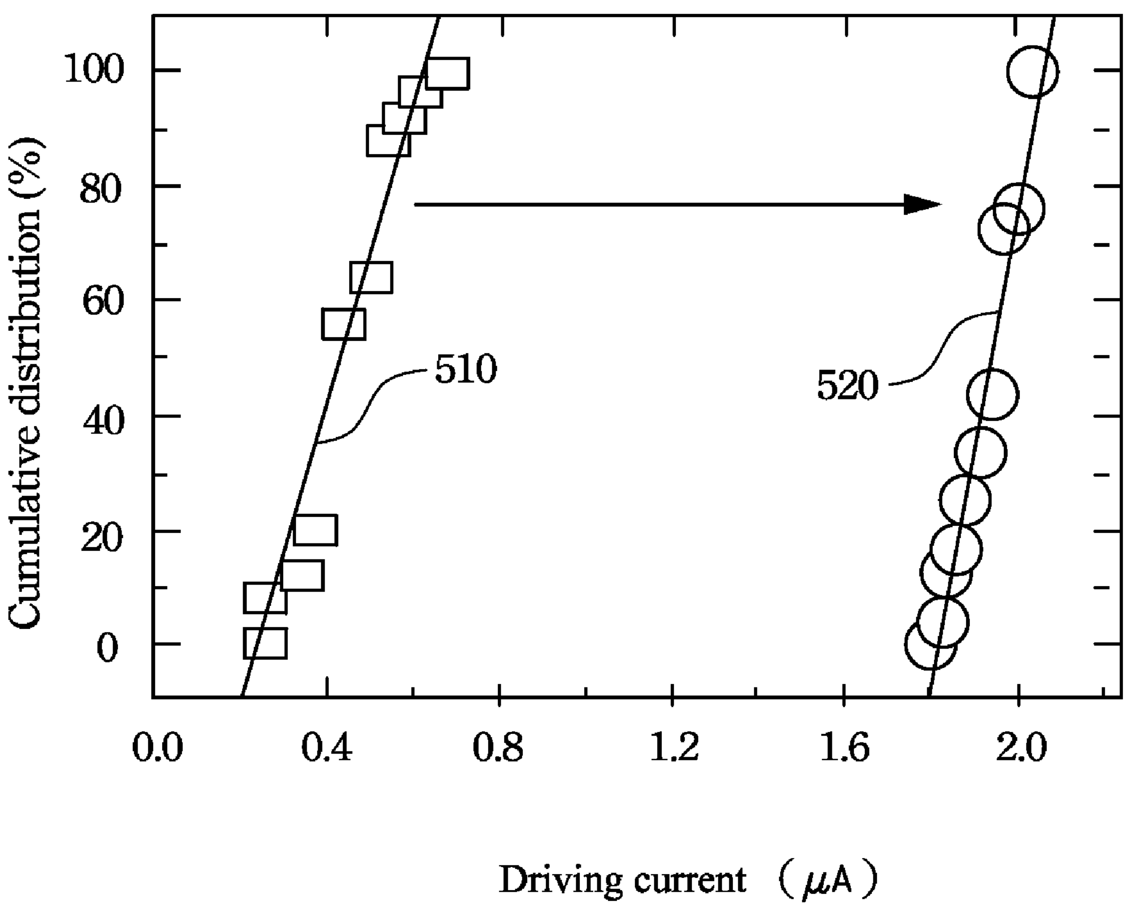
FIG. 5 is a graph depicting one or more aspects of the present disclosure.

Please refer to FIG. 5. FIG. 5 is a graph depicting one or more aspects of the present disclosure. The ordinate of the graph represents Cumulative distribution (%), and the abscissa of the graph represents the driving current (μA). □ shows the distribution of the driving currents before the semiconductor memory device 110 is programmed, which has the trend 510. ○ shows the distribution of the driving current after the semiconductor memory device 110 is programmed, which has the trend 520. The graph means that the driving current shall be improved after the semiconductor memory device 110 is programmed. In this way, non-uniformity issue of the lighting devices of flat-panel display should be solved or circumvented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tunable current driver for a flat-panel display, which comprising:

- a semiconductor memory device, comprising:
- a first gate electrode;
- a first trapping layer disposed under the first gate electrode;
- a first gate oxide layer disposed under the first trapping layer;
- a first polysilicon layer disposed under the first gate oxide layer and on a glass substrate;
- a first source/drain pair formed in the first polysilicon layer at opposing sides of the first gate electrode, wherein one of the first source/drain pair is electrically coupled with a lighting device;
- a selective transistor comprising a second gate electrode and a second source/drain pair, wherein one of the second source/drain pair is electrically coupled with the first gate electrode, the other of the second source/drain pair is electrically coupled with a data line, and the second gate electrode is electrically coupled with a select line; and at least one buffer layer disposed between the first polysilicon layer and the glass substrate.

2. The tunable current driver as claimed in claim 1, wherein the first trapping layer comprises a material selected from the group consisting of SiNx, SiON, nanocrystal, and combinations thereof.

3. The tunable current driver as claimed in claim 1, wherein the selective transistor is a NMOS.

4. The tunable current driver as claimed in claim 1, wherein the selective transistor further comprising:

a second trapping layer disposed under the second gate electrode;

a second gate oxide layer disposed under the second trapping layer; and a second polysilicon layer disposed under the second gate oxide layer and on a glass substrate, wherein the second source/drain pair formed in the second polysilicon layer at opposing sides of the second gate electrode.

5. The tunable current driver as claimed in claim 1, wherein the selective transistor is a programmable PMOS.

6. The tunable current driver as claimed in claim 1, wherein the semiconductor memory device's threshold voltage is changed by means of F-N tunneling mechanism, channel hot electron, band-to-band-tunneling mechanism or gate hole injections.

7. The tunable current driver as claimed in claim 1, wherein the lighting device is an OLED.

8. An operating method for the tunable current driver of claim 1, which comprising:

driving the semiconductor memory device to output a driving current;

determining whether the driving current is less than a predetermined current; and programming the semiconductor memory device when the driving current is less than a predetermined current.

9. The operating method as claimed in claim 8, further comprising:

amplifying the driving current and the predetermined current before determining whether the driving current is less than the predetermined current.

10. The operating method as claimed in claim 8, wherein the predetermined current is about 1.5 μA to about 2 μA.

11. The operating method as claimed in claim 8, wherein the step of programming the semiconductor memory device, comprising:

applying a first electrical potential to the select line;

applying a second electrical potential to the data line; and applying a third electrical potential to the other of the first source/drain pair.

12. The operating method as claimed in claim 11, wherein the first electrical potential minus the second electrical potential leaves about 2 Volts, and the third electrical potential is about 0 Volt.

13. The operating method as claimed in claim 11, wherein the first electrical potential is about 25 Volt, about 30 Volt, about 35 Volt or about 40 Volt.

14. The operating method as claimed in claim 8, further comprising:

driving a standard semiconductor memory device to output the predetermined current under the same condition as driving the semiconductor memory device.

* * * * *